(12) United States Patent
Shi

(10) Patent No.: US 8,089,085 B2
(45) Date of Patent: Jan. 3, 2012

(54) HEAT SINK BASE FOR LEDS

(75) Inventor: Wei Shi, San Jose, CA (US)

(73) Assignee: Bridgelux, Inc., Livermore, CA (US)

(*) Notice: Subject to any disclaimer, the term of this patent is extended or adjusted under 35 U.S.C. 154(b) by 357 days.

(21) Appl. No.: 12/393,559

(22) Filed: Feb. 26, 2009

(65) Prior Publication Data

US 2010/0213808 A1 Aug. 26, 2010

(51) Int. Cl.
- H01L 29/22 (2006.01)
- H01L 29/227 (2006.01)
- H01L 33/00 (2010.01)
- H01L 23/10 (2006.01)
- H01L 23/34 (2006.01)
- H01L 23/28 (2006.01)

(52) U.S. Cl. ......... 257/98; 257/99; 257/706; 257/707; 257/720; 257/796; 257/E23.051; 257/E23.101; 257/E23.102; 257/E23.103; 257/E23.104; 257/E23.105

(58) Field of Classification Search ............ 257/98, 257/99, 706, 707, 720, 796, E23.051, E23.101, 257/E23.102, E23.103, E23.104, E23.105
See application file for complete search history.

(56) References Cited

U.S. PATENT DOCUMENTS

| | | | |
|---|---|---|---|
| 6,124,635 A * | 9/2000 | Kuwabara | 257/703 |
| 7,382,620 B2 * | 6/2008 | Khanna et al. | 361/719 |
| 7,479,662 B2 * | 1/2009 | Soules et al. | 257/98 |
| 7,521,872 B2 * | 4/2009 | Bruning | 315/158 |
| 7,547,124 B2 * | 6/2009 | Chang et al. | 362/373 |
| 7,560,820 B2 * | 7/2009 | Amiotti et al. | 257/788 |
| 7,566,152 B2 * | 7/2009 | Ishida | 362/509 |
| 7,622,803 B2 * | 11/2009 | Parker et al. | 257/706 |
| 7,740,380 B2 * | 6/2010 | Thrailkill | 362/294 |
| 7,800,121 B2 * | 9/2010 | Aanegola et al. | 257/98 |
| 7,825,427 B2 * | 11/2010 | Xu et al. | 257/100 |
| 7,868,332 B2 * | 1/2011 | Rho et al. | 257/79 |
| 7,887,384 B2 * | 2/2011 | Shaikevitch et al. | 445/23 |
| 7,901,107 B2 * | 3/2011 | Van De Ven et al. | 362/231 |
| 7,906,793 B2 * | 3/2011 | Negley | 257/98 |
| 2002/0056908 A1 * | 5/2002 | Brownell et al. | 257/714 |
| 2006/0124953 A1 * | 6/2006 | Negley et al. | 257/99 |
| 2007/0109775 A1 * | 5/2007 | Chen | 362/187 |
| 2007/0153541 A1 * | 7/2007 | Bennett et al. | 362/574 |
| 2008/0061314 A1 * | 3/2008 | Liaw et al. | 257/99 |
| 2008/0291675 A1 * | 11/2008 | Lin et al. | 362/247 |
| 2009/0034201 A1 * | 2/2009 | Brandes | 361/704 |
| 2009/0096086 A1 * | 4/2009 | Natarajan et al. | 257/714 |
| 2009/0096087 A1 * | 4/2009 | Sauciuc et al. | 257/717 |
| 2009/0224400 A1 * | 9/2009 | Rahman | 257/713 |
| 2010/0038660 A1 * | 2/2010 | Shuja | 257/98 |

\* cited by examiner

*Primary Examiner* — Ida M Soward
(74) *Attorney, Agent, or Firm* — Haynes and Boone, LLP

(57) ABSTRACT

An LED assembly can include a heat sink base, at least one LED die attached to the heat sink base, and a lens. One or more layers of phosphor can be formed upon the lens. A heat sink, such as a finned heat sink, can attach the heat sink base to the lens. Heat from the LED die can flow through the heat sink base to the heat sink, from which the heat can be dissipated. Similarly, heat from phosphors can flow through the lens to the heat sink, from which the heat can be dissipated. By removing heat from the LED die, more current can be used to drive the LED die, thus providing brighter light. By removing heat from the phosphors, desired colors can be more reliably provided.

17 Claims, 6 Drawing Sheets

//HEAT SINK BASE FOR LEDS

TECHNICAL FIELD

The present invention relates generally to light emitting diodes (LEDs). The present invention relates more particularly to a heat sink base for enhancing the optical performance of a LED by reducing the temperature of one or more junctions of the LED and/or by reducing the temperature of one or more phosphors of the LED.

BACKGROUND

Light emitting diodes (LEDs) are well known. As the cost of LEDs continues to fall and as they become more efficient, more different applications are being found for them and the applications are becoming more sophisticated. For example, LEDs are being used to provide light in such applications as flashlights, displays, and general illumination.

In such applications, LEDs replace light bulbs or lamps. In order to provide the desired amount and quality of light (the amount and quality similar to that provided by light bulbs or lamps), sufficiently bright LEDs are required. However, brighter LEDs require more current and more current results in the production of more heat. Heat reduces the efficiency of LEDs and undesirable generates color shifts.

Thus, although contemporary LEDs have proven generally suitable for some purposes, they possess inherent deficiencies which detract from their overall effectiveness and desirability. Therefore, it is desirable to provide LEDs that can more efficiently use higher current, such as by better managing the heat produced thereby.

BRIEF SUMMARY

Methods and systems are disclosed herein to provide cooling for light emitting diodes (LEDs). In accordance with an aspect, an LED assembly can comprise a heat sink base, at least one LED die attached to the heat sink base, and a heat sink attached the heat sink base.

In accordance with an aspect, an LED assembly can comprise a heat sink base, at least one LED die attached to the heat sink base, and means for dissipating heat attached the heat sink base.

In accordance with an aspect, a heat sink base can comprise a heat conductive member that is configured to facilitate the attachment of at least one LED die thereto and that is configured to facilitate the attachment of a heat sink thereto.

In accordance with an aspect, a heat sink assembly for LEDs can comprise a heat sink base that is configured to facilitate the attachment of at least one LED die thereto and heat sink fins attachable to the heat sink base.

In accordance with an aspect, a heat sink assembly for LEDs can comprise a heat sink base having a ledge that is configured to mitigate leakage of light from an LED die past a lens.

In accordance with an aspect, a method for making an LED assembly can comprise attaching at least one LED die to a heat sink base and attaching heat sink fins to the heat sink base.

By providing enhanced heat dissipation from the LED dice, more current can be used so as to provide brighter LEDs that are suitable for use in such applications as flashlights, displays, and general lighting. Further, by providing enhanced heat dissipation for the LED dice, phosphors can be maintained at a lower temperature, such that the phosphors operate more efficiently. When phosphors operate more efficiently, desired colors can be provided thereby more reliably.

This invention will be more fully understood in conjunction with the following detailed description taken together with the following drawings.

DETAILED DESCRIPTION

Figure 1:
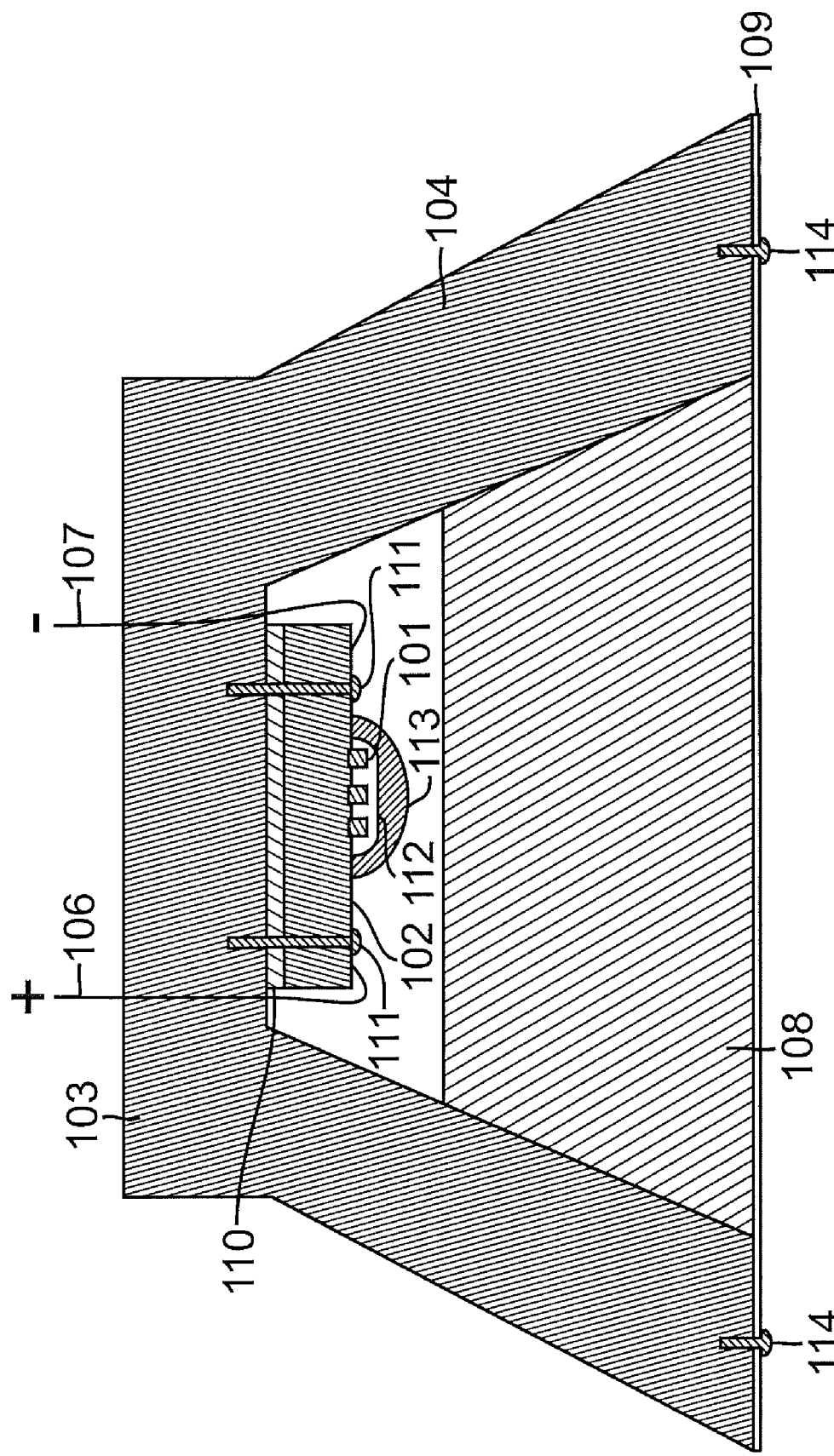
FIG. 1 is a semi-schematic cross-sectional side view of an LED assembly having a heat sink, according to contemporary practice.

Methods and systems for enhancing the optical performance of a LED by reducing the temperature Tj of a junction or active area of the LED and/or by reducing the temperature of one or more phosphors of the LED are disclosed.

As discussed above, the heat produced by current flow through a light emitting diode (LED) can be accommodated, so as to facilitate the use of the higher currents that are required in order to provide brighter LEDs. The temperature $T_j$ of the junction of an LED must typically be kept below approximately 150° C. in order for the LED to produce light efficiently.

The temperature of any phosphors that are used to modify the color of light for an LED must be as low as possible so as to provide desired color conversion efficiency. As those skilled in the art will appreciate, the Stokes shift will tend to cause the phosphors to heat up. The Stokes shift is the difference in the energy levels between the absorption spectra and the emission spectra of a fluorescent material. Since more energy is absorbed as visible light than is emitted as visible light, the difference in energy becomes heat.

As the color conversion efficiency of the phosphors of an LED drops, the color of the light produced thereby changes. Thus, it is necessary to maintain a desired color conversion efficiency so as to reliably provide the desired color of light.

An LED assembly can include a heat sink base, at least one LED die attached to the heat sink base, and a lens. One or more layers of phosphor can be formed upon the lens. A heat sink, such as a finned heat sink, can attach the heat sink base to the first lens. Heat from the LED die can flow through the heat sink base to the heat sink, from which the heat can be dissipated.

Similarly, heat from phosphors can flow through the lens to the heat sink, from which the heat can be dissipated. By removing heat from the LED die, more current can be used to drive the LED die, thus providing brighter light. By removing heat from the phosphors, desired colors can be provided.

One or more aspects mitigate the temperature of the junction of an LED. Reducing the temperature of an LED increases the efficiency thereof. The use of higher current is thus facilitated. The use of higher current facilitates the production of brighter LEDs that are better suited for use in applications such as flashlights, displays, and general illumination.

One or more aspects mitigate the temperature of any phosphors that are used to modify the color of an LED. By keeping the phosphors at a lower temperature, better efficiency of the phosphors is maintained. In this manner, the desired color of light from the LED is more reliably provided.

In accordance with an aspect, an LED assembly can comprise a heat sink base, at least one LED die attached to the heat sink base, and a heat sink attached to the heat sink base. The heat sink can have fins formed thereon.

A lens can be attached to the heat sink. The lens can comprise a lump lens. The lens can comprise any other desired type of lens. A phosphor layer can be formed upon the lens. For example, a phosphor layer can be formed upon a surface of the lens that is closest to the LED die. Another lens can be formed upon the heat sink base, such that the other lens substantially covers the LED die/dice.

The heat sink base can comprise a material that is substantially heat transmissive. For example, the heat sink base can comprise copper, aluminum, or steel. The heat sink base can comprise a material having a thermal conductivity greater than 100 W/mK.

Vias can be formed in the heat sink base. Electrical conductors within the vias can provide power to the LED die/dice. The electrical conductors that pass through the via can cooperate with conductive traces formed upon the heat sink base so as to power the LED die/dice.

The LED assembly can comprise either one or a plurality of LED dice that are attached to the heat sink base. For example, the LED assembly can comprise 1, 2, 4, 8, or any other desired number of LED die.

The heat sink can be bolted to the heat sink base. The heat sink can at least partially define a seal that inhibits light leakage from the LED die/dice. For example, the heat sink can at least partially define a ledge that inhibits light leakage from the LED die/dice.

Referring now to FIG. 1, a contemporary LED assembly has LED dice 101 attached to a substrate 102. The substrate 102 can comprise aluminum (Al) or copper (Cu). The substrate 102 is attached to a heat sink base 103 via screws 111. A thermal interface material (TIM) 110 is used to improve heat transfer from the substrate 102 to the heat sink base 103. The substrate 102 and heat sink base 103 are generally round when viewed from above.

Positive 106 and negative 107 leads cooperate with wire bonds (not shown) to provide current to the LED dice 101. Conductive traces can be formed upon the substrate 102 to facilitate the communication of current from the positive 106 and negative 107 leads to the LED dice 101 (via the wire bonds).

A layer of phosphors 112 change the color of light emitted by the LED dice 101. Thus, more desirable colors can be provided by the LED assembly. For example, the phosphors 112 can be used to change the color of light emitted by the LED dice 101 from blue to a substantially white color.

A lens 113 is formed over the layer of phosphors 112 and focuses light from the LED dice 101. The lens 113 is formed of silicon.

Heat sink fins 104 can be formed integrally with the heat sink base 103. Alternatively, the heat sink fins 104 can be formed separately with respect to the heat sink base 103 and then attached thereto, such as via fasteners. The heat sink fins 104 radiate heat from the heat sink base 103 into the ambient air. Thus, heat from the LED dice 101 can be dissipated, at least to some degree.

A lens 108 is attached to the heat sink fins 104. The lens 108 is held in place via a ring holder 109. The ring holder 109 is attached to the heat sink fins 104 by screws 114.

Thermal resistance is a measure of how readily heat flows through an object. The higher the thermal resistance, the less readily heat flows. The substrate 102 can have a thermal resistance $R_{jc}$ of 1° C./W to 2° C./W. The thermal interface material (TIM) 110 can have a thermal resistance R of approximately 0.5° C./W. Thus, contemporary LED assemblies can have a total thermal resistance of 2.5° C./W or more. A thermal resistance of 10° C./W is generally considered excessive.

It is desirable to reduce the thermal resistance of an LED assembly so as to enhance the efficiency of the LED, thus allowing the use of higher currents. The use of higher currents can facilitate the production of brighter LEDs that are suitable for such applications as flashlights, displays, and general illumination.

It is also desirable to reduce the thermal resistance of an LED assembly so as to enhance the efficiency of the phosphors used to change the color of light emitted by the LED dice thereof. Enhancing the efficiency of such phosphors provides more reliable color stability.

Referring now to FIGS. 2-7, aspects facilitate the construction of an LED assembly having a more desirable, i.e., lower thermal resistance so as to provide increased brightness and improved color stability.

Figure 2:
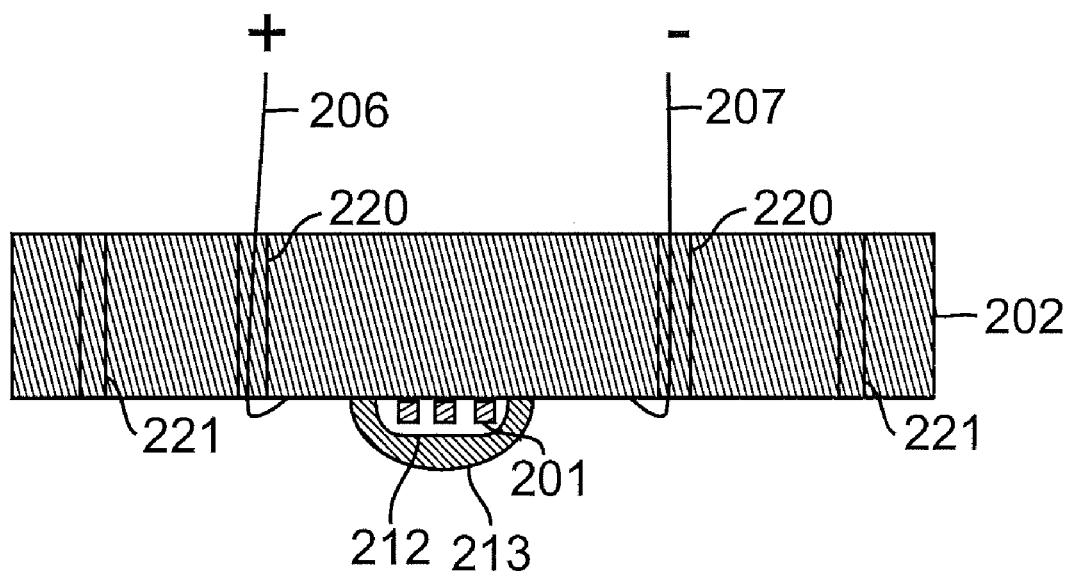
FIG. 2 is a semi-schematic cross-sectional side view of a plurality of LEDs that are packaged directly onto a heat sink base, according to an aspect.

With particular reference to FIG. 2, LED dice 201 can be attached directly (without the use of a separate substrate such as substrate 102 of FIG. 1) to a heat sink base 202. For example, the LED dice 201 can be solder bonded to the heat sink base 202. The heat sink base 202 can have a thermal conductivity of greater than 100 W/mK. The heat sink base can comprise copper, aluminum, or steel, for example.

The heat sink base 202 can be generally circular when viewed from above. Alternatively, the heat sink base 202 can have any other desired shape. For example, the heat sink base 202 can be square, pentagonal, octagonal, or oval when view from above.

Attachment of the LED dice 201 directly to the heat sink base 202 eliminates the resistance to heat flow associated with the substrate 102 and with the thermal interface material (TIM) 110 of FIG. 1. Thus, heat from the LED dice 201 flows more readily into the heat sink base 202 (as compared to the heat sink base 103 of FIG. 1).

Positive 206 and negative 207 leads can cooperate with wire bonds (not shown) to provide current to the LED dice 201, as discussed above. The leads can pass through vias 220 formed in the heat sink base 202. The vias 220 can be plated through such that the leads do not need to pass therethrough. Conductive traces (not shown) can be formed upon the heat sink base 202 to facilitate the communication of current from the positive 206 and negative 207 leads to the LED dice 201 according to well known principles.

A layer of phosphors 212 can be formed upon the LED dice 201 to change the color of light emitted by the LED dice 201. Thus, more desirable colors can be provided by the LED assembly. For example, the phosphors 212 can be used to change the color of light emitted by the LED dice 201 from blue to a substantially white color.

A lens 213 can be formed upon or proximate the layer of phosphors 212 to focus light from the LED dice 201. The lens 213 can comprise silicon. Those skilled in the art will appreciate that other materials are also suitable for the formation of the lens 213.

Through holes or bores 221 can facilitate the use of fasteners, such as screws or bolts. Such fasteners can be used to attach the heat sink base 202 to heat sink fins 404 (FIG. 4) as discussed below.

Figure 3:
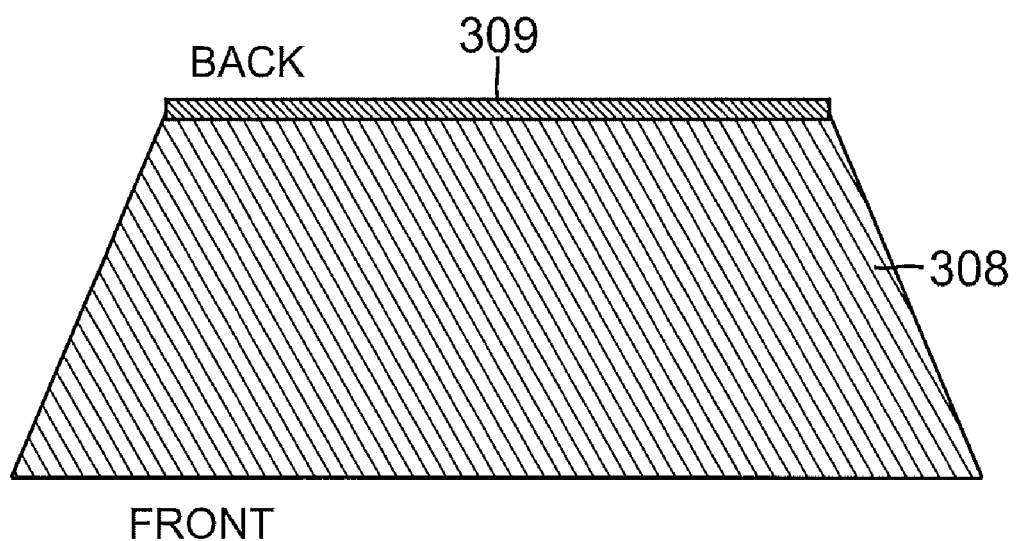
FIG. 3 is a semi-schematic cross-sectional side view of a lump lens having a layer of phosphor formed thereon, according to an aspect.

With particular reference to FIG. 3, a lump lens 308 can have a layer of phosphor 309 formed upon the back side (the side that will be closest to the LED dice 201 when assembled) thereof. A phosphor layer can similarly be formed upon the front side of the lump lens 308. When a phosphor layer is formed upon the lump lens 308, then the phosphors 212 at the LED dice 201 can be omitted. Any desired combination of phosphors on the back side of lump lens 308, on the front side of lump lens 308, and upon the heat sink base 202 can be used.

Figure 4:
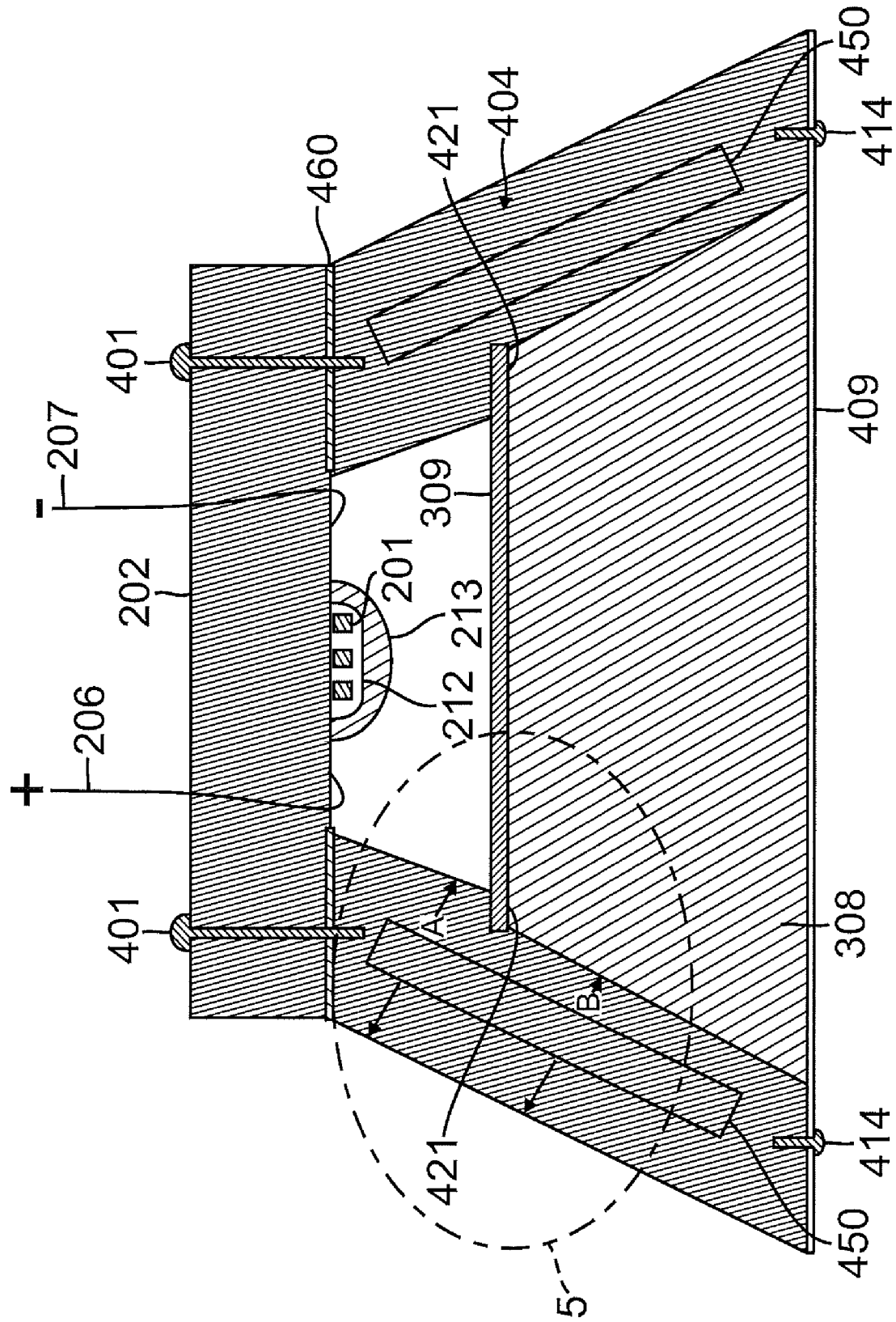
FIG. 4 is a semi-schematic cross-sectional side view of an LED assembly having a heat sink base, according to an aspect.

With particular reference to FIG. 4, the heat sink base 202 can be assembled to a heat sink having heat sink fins. For example, the heat sink base 202 can be attached to heat sink fins 404 with fasteners, such as via bolts or screws 401. An optional layer of thermal interface material 460 can be disposed between heat sink base 202 and heat sink fine 404. Alternatively, the heat sink base 202 can be attached to the heat sink fins via solder 460 or can be otherwise attached to the heat sink fins 404. Thus, layer 460 can represent either thermal interface material or solder.

The lump lens 308 can be inserted into the heat sink fins 404 and retained in place via ring holder 409. Ring holder 409 can be attached to the heat sink fins 404 via fasteners, such as bolts or screws 414. Other methods for attaching the lump lens 308 to the heat sink fins and/or for attaching the ring holder 409 to the heat sink fins 404 are likewise suitable.

One or more heat pipes 450 can be formed within or attached to the heat sink fins 404 to better facility heat flow from the LED die 201 therethrough. The heat pipe can comprise channels or passages within which a fluid is disposed. The heat pipe can extend from the heat sink fins 404 into the heat sink base 202, if desired. The heat pipe 450 can be formed integrally with the heat sink, e.g., with the heat sink base 202 and/or the heat sink fins 404.

As those skilled in the art will appreciate, a heat pipe is a heat transfer device that moves heat between hotter and colder interfaces thereof. At the hot interface of the heat pipe, the fluid turns into vapor and the vapor flows to the cold interface, where it condenses. The condensed vapor or liquid then travels by capillary action back to the hot interface and the cycle repeats.

Figure 5:
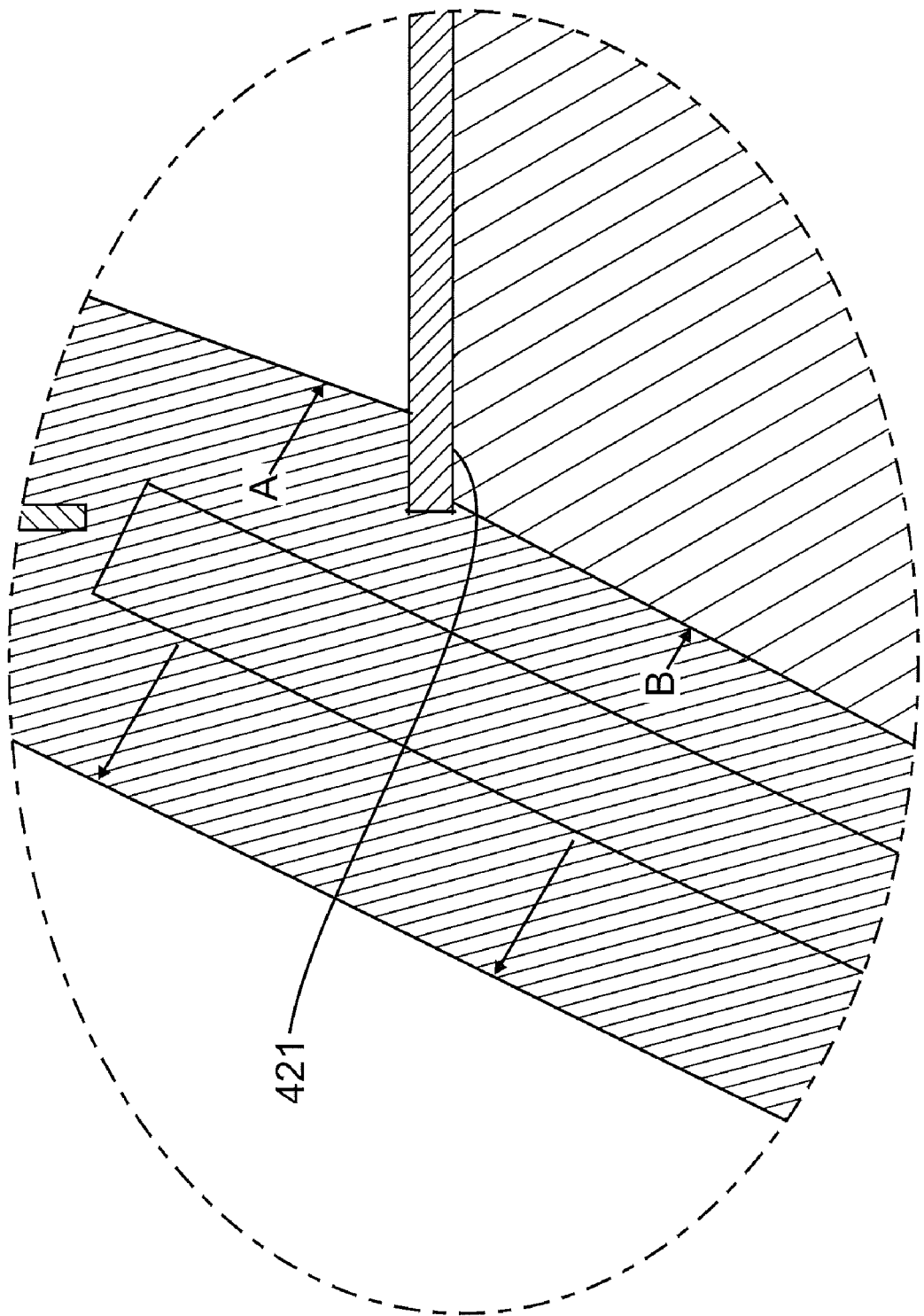
FIG. 5 is an enlarged semi-schematic cross-sectional view of the heat sink fins and phosphor layer of FIG. 4, better showing the ledge of the heat sink fins.

Referring now to FIGS. 4 and 5, a ledge 421 formed in the heat sink fins 404 can define a light seal that inhibits the transmission of light (such as blue light when the phosphors layer 212 is not used) from the LED dice 201 between the lump lens 308 and the heat sink fins 404. Thus, the use of such a seal can better facilitate the production of a desired color of light by the LED assembly.

More particularly, the ledge 421 can be a cut out portion of the heat sink fins 404 that receives and abuts a periphery of the phosphor layer 309, as best shown in FIG. 5. Light from the LED dice 201 is inhibited from passing between the phosphor layer 309 and the heat sink fins 404 by the ledge 421. That is, the ledge 421 allows the periphery of the phosphor layer 309 to be positioned within the heat sink fins 404 so that light from the LED dice 201 must pass through the phosphor layer 309 in order to escape the LED assembly. Such construction can prevent blue light from the LED dice 201 from bypassing the phosphor layer 309 and thus contributing more blue light than is desired to the output of the LED assembly. In this manner, substantially all of the light from the LED assembly passes through the phosphor layer 309 such that a desired color of light, e.g., white light, is provided by the LED assembly.

Figure 6:
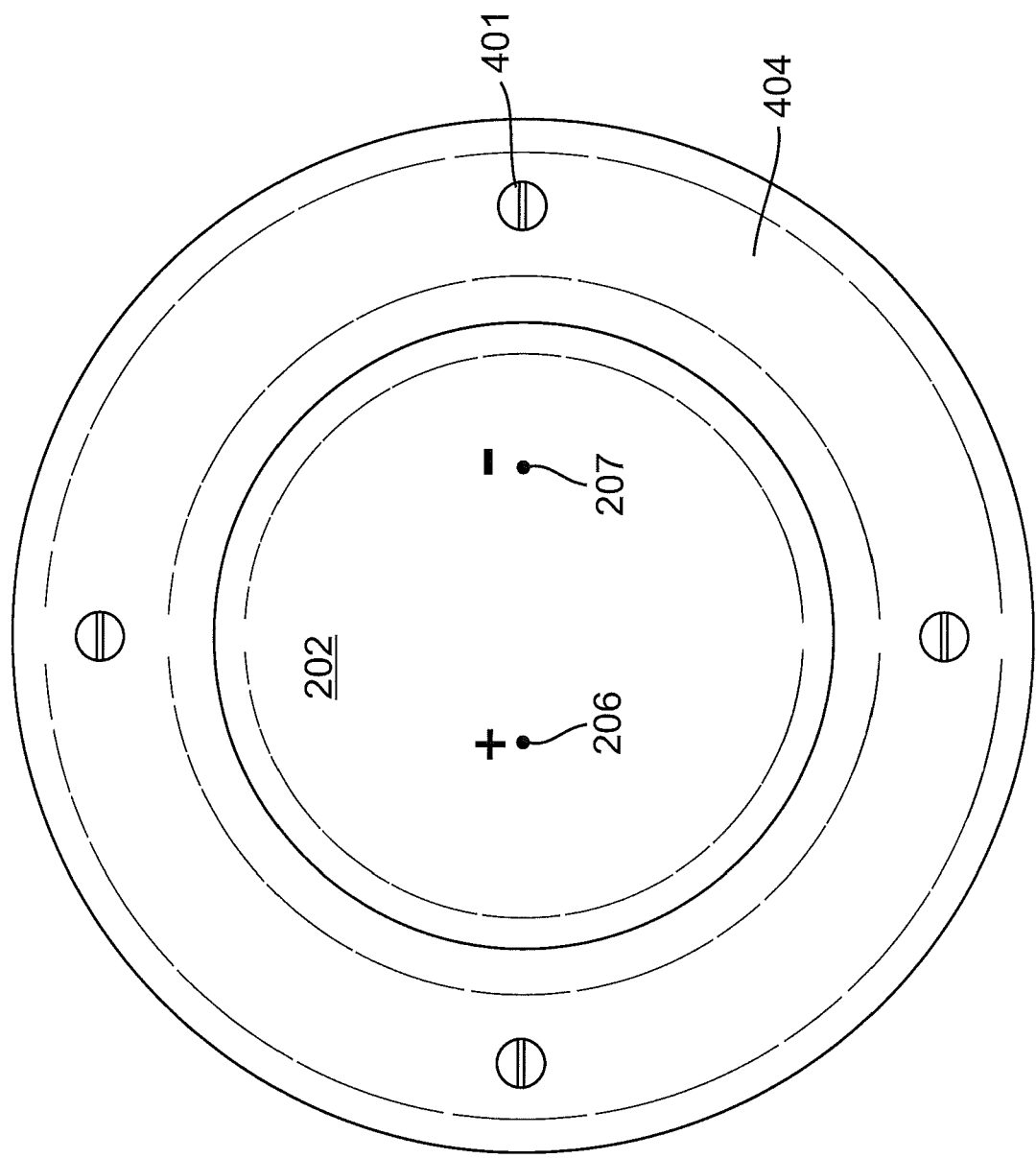
FIG. 6 is a top view of the LED assembly of FIG. 4.

Referring now to FIG. 6, a top view of the LED assembly shows that the LED assembly is generally round in configuration. That is, the heat sink base 202 and the heat sink fins 404 are round when viewed from above. However, the LED assembly can be of any desired shape and configuration. For example, the LED assembly can be round, oval, square, rectangular, pentagonal, octagonal, or of any other shape when viewed from above.

The ledge 421 can be define by making the width of the heat sink fins 404 greater (as shown by dimension A) proximate the heat sink base 202 and less (as shown by dimension B) farther from the heat sink base 202. Both the heat sink fins 404 and the ledge 421 can be generally circular when viewed from above. Alternatively, the heat sink fins 404 and/or the ledge 421 can have any other desired shape. For example, the heat sink fins 404 and/or the ledge 421 can be square, pentagonal, octagonal, or oval when viewed from above.

The phosphor layer 309 extends over and along the ledge 421 such that substantially all of the light from the LED dice 201 that is emitted by the LED assembly must pass through the phosphor layer 309. Thus, substantially no light from the LED dice 201 leaks past the lens 308 (and thus past the phosphor layer 309), such as between the lens 308 and the heat sink fins 404.

The heat sink base 202, the heat sink fins 404, and the lump lens 308 can cooperate to define a package for the LED dice 201. Although the heat sink fins 404 are generally associated with dissipating heat from the LED dice 201 into the ambient air, the heat sink base 202, the heat sink fins 404, and the lump lens 308 can all dissipate heat from the LED dice 201 into the ambient air and thus can all contribute to the cooling of the LED dice 201.

Figure 7:
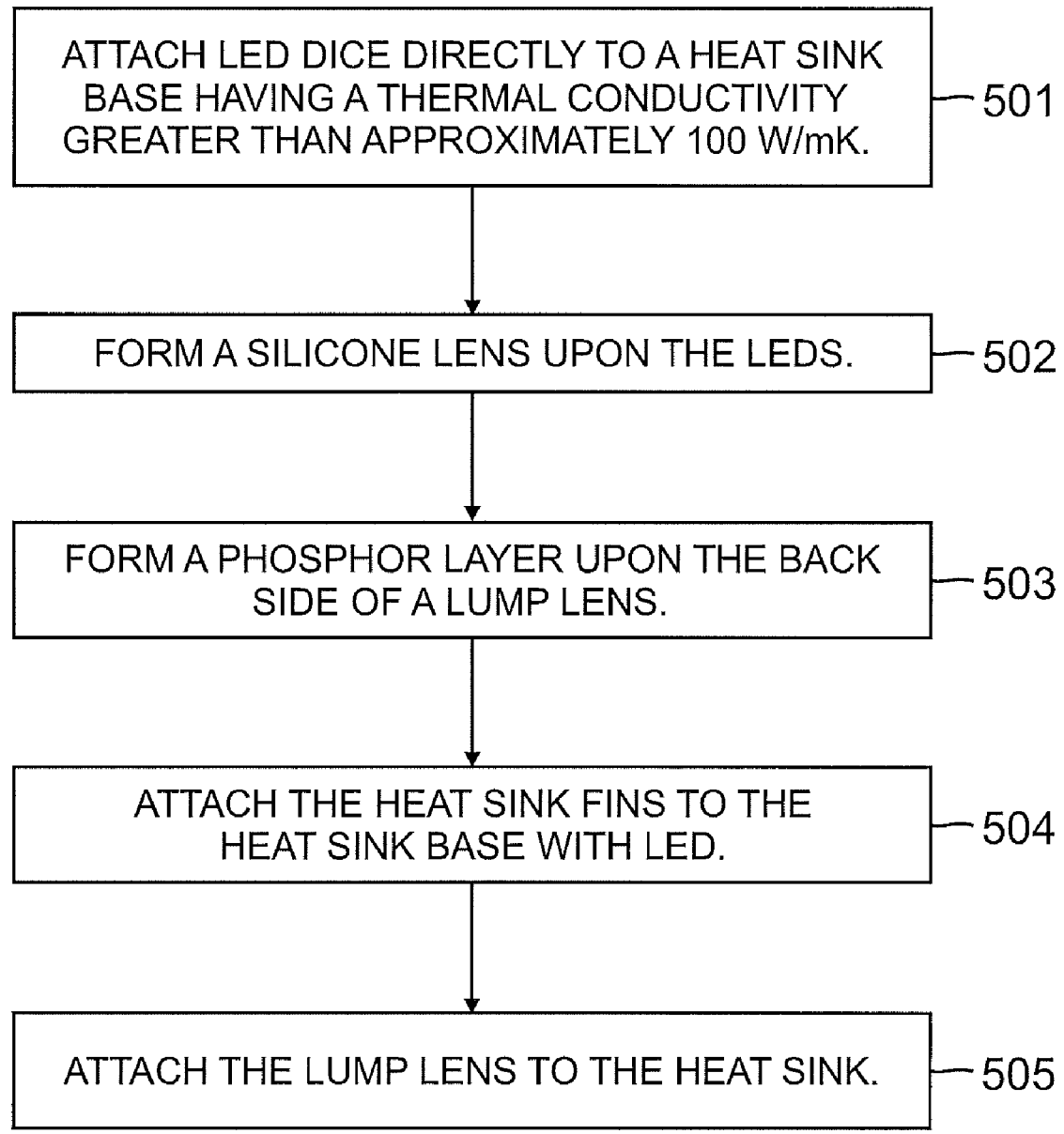
FIG. 7 is a flow chart showing a method for assembling an LED assembly having a heat sink base, according to an aspect Embodiments and aspects of the present invention and their advantages are best understood by referring to the detailed description that follows. It should be appreciated that like reference numerals are used to identify like elements illustrated in one or more of the figures.

With particular reference to FIG. 7, a method for making an LED assembly according to an aspect is shown. One or more LED dice can be attached directly to a heat sink base (such as heat sink base 202 of FIG. 2), as indicated in block 501. The heat sink base can have a minimum thermal conductivity of approximately 100 W/mK.

A silicone lens (such as silicone lens 213 of FIG. 2) can be formed upon the heat sink base, as indicated in block 502. The silicone lens can formed so as to generally cover the LED dice.

A phosphor layer (such as phosphor layer 309 of FIGS. 3 and 4) can be formed upon the back side of a lump lens, as indicated in block 503. A phosphor layer can be formed upon the back side of the lump lens, upon the front side of the lump lens, upon the heat sink base, and/or at any other desired location.

Heat sink fins (such as heat sink fins 404 of FIG. 4) can be attached to the heat sink base with LED, as indicated in block 504. Fasteners, such as screws, can facilitate such attachment. Any other desired method for attaching the heat sink fins to the heat sink base with LED can be used.

The lump lens can be attached to the heat sink, as indicated in block 505. A thermal interface material (such as a thermal interface material comprises of polymer or solder) can be disposed intermediate the heat sink base and the heat sink fins. The heat sink base and the heat sink fins can cooperate so as to define a heat sink that enhances heat dissipation from the LED dice attached to the heat sink base.

As used herein, the term "active area" or "active region" can be defined to include a region in a light-emitting diode where injected electrons and holes recombine to generate photons in the LED when current is applied.

As used herein "formed upon" can be defined to include deposited, etched, attached, or otherwise prepared or fabricated upon, such as when referring to the forming the various layers.

As used herein "on" and "upon" can be defined to include positioned directly or indirectly on or above.

As used herein, the term "package" can be defined to include an assembly of elements that houses one or more LED chips and provides an interface between the LED chip(s) and a power source to the LED chip(s). A package can also provide optical elements for the purpose of directing light generated by the LED chip. Examples of optical elements are lens and reflectors.

As used herein, the term "transparent" can be defined to include the characterization that no significant obstruction or absorption of electromagnetic radiation occurs at the particular wavelength or wavelengths of interest.

As used herein, the term "heat sink" can be defined to include any structure that facilitates heat dissipation when heat flows therethrough. Heat from a source, such as an LED die, can flow through a heat sink and into the air, water, and/or another structure.

One or more aspects mitigate the temperature of the junction of an LED. Reducing the temperature of an LED increases the efficiency thereof. The use of higher current is thus facilitated. The use of higher current facilitates the production of brighter LEDs that are better suited for use in applications such as flashlights, displays, and general illumination.

One or more aspects mitigate the temperature of any phosphors that are used to modify the color of an LED. By keeping the phosphors at a lower temperature, better efficiency of the phosphors is maintained. In this manner, the desired color of light from the LED is more reliably provided.

It is understood that the various features and aspects discussed herein can be used in various embodiments in any desired combination. Thus, a particular embodiment can have one or more features or aspects that were discussed in association with one or more different embodiments.

Embodiments and aspects described above illustrate, but do not limit, the invention. It should also be understood that numerous modifications and variations are possible in accordance with the principles of the present invention. Accordingly, the scope of the invention is defined only by the following claims.

The invention claimed is:

1. An LED assembly comprising:
   a heat sink base;
   at least one LED die attached to the heat sink base;
   a heat sink attached to the heat sink base; and
   a first lens attached to the heat sink and a phosphor layer formed upon the first lens.

2. The LED assembly as recited in claim 1, further comprising fins formed upon the heat sink.

3. The LED assembly as recited in claim 1, wherein the first lens comprises a lump lens.

4. The LED assembly as recited in claim 1, wherein the phosphor layer is formed upon a surface of the first lens that is closest to the LED die.

5. The LED assembly as recited in claim 1, further comprising a second lens formed upon the heat sink base and substantially covering the LED die/dice.

6. The LED assembly as recited in claim 1, wherein the heat sink base comprises copper.

7. The LED assembly as recited in claim 1, wherein the heat sink base comprises aluminum.

8. The LED assembly as recited in claim 1, wherein the heat sink base comprises steel.

9. The LED assembly as recited in claim 1, wherein the heat sink base comprises a material having a thermal conductivity greater than 100 W/mK.

10. The LED assembly as recited in claim 1, further comprising vias formed in the heat sink base and electrical conductors within the vias for providing power to the LED die.

11. The LED assembly as recited in claim 1, wherein the LED assembly comprises a plurality of LED dice formed upon the heat sink base.

12. The LED assembly as recited in claim 1, wherein the heat sink is bolted to the heat sink base.

13. The LED assembly as recited in claim 1, wherein the heat sink at least partially defines a seal that inhibits leakage of light from the LED die/dice.

14. The LED assembly as recited in claim 1, wherein the heat sink at least partially defines a ledge that inhibits leakage of light from the LED die/dice.

15. The LED assembly as recited in claim 1, further comprising a heat pipe configured to move heat through the heat sink.

16. The LED assembly as recited in claim 1, further comprising a heat pipe formed integrally with the heat sink and configured to move heat through the heat sink.

17. An LED assembly comprising:
   a heat sink base;
   at least one LED die attached to the heat sink base;
   means for dissipating heat attached the heat sink base; and
   a first lens attached to the means for dissipating heat and a phosphor layer formed upon the first lens.

* * * * *